(12) United States Patent
Ikehashi

(10) Patent No.: US 8,921,958 B2
(45) Date of Patent: Dec. 30, 2014

(54) MEMS ELEMENT

(75) Inventor: Tamio Ikehashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 13/603,967

(22) Filed: Sep. 5, 2012

(65) Prior Publication Data

US 2013/0234263 A1    Sep. 12, 2013

(30) Foreign Application Priority Data

Nov. 11, 2011    (JP) ................................. 2011-247284

(51) Int. Cl.
*B81B 3/00*    (2006.01)
*G01L 9/00*    (2006.01)

(52) U.S. Cl.
CPC ............. *B81B 3/0018* (2013.01); *G01L 9/0044* (2013.01); *B81B 3/0051* (2013.01); *B81B 2201/0264* (2013.01); *G01L 9/0072* (2013.01)
USPC ............................... 257/417; 257/254; 73/718

(58) Field of Classification Search
CPC ....................... H01H 2001/0085; H01L 41/096
USPC ............ 257/254, 414–420; 73/715, 718, 724, 73/727
See application file for complete search history.

(56) References Cited

U.S. PATENT DOCUMENTS

| 6,122,973 | A * | 9/2000 | Nomura et al. ................... 73/724 |
| 6,631,645 | B1 * | 10/2003 | Satou et al. ....................... 73/718 |
| 6,877,383 | B2 * | 4/2005 | Horie et al. ....................... 73/754 |
| 6,945,115 | B1 * | 9/2005 | Wang ................................ 73/718 |
| 7,586,393 | B2 * | 9/2009 | Tilmans et al. ................ 333/232 |
| 7,625,825 | B2 | 12/2009 | Chan |
| 8,148,792 | B2 * | 4/2012 | Nakatani ......................... 257/415 |
| 2004/0125970 | A1 * | 7/2004 | Kawakubo ...................... 381/190 |
| 2004/0164423 | A1 * | 8/2004 | Sherrer ........................... 257/774 |
| 2006/0017533 | A1 * | 1/2006 | Jahnes et al. ..................... 335/78 |
| 2006/0267109 | A1 * | 11/2006 | Ohguro ........................... 257/396 |
| 2007/0013268 | A1 * | 1/2007 | Kubo et al. ..................... 310/324 |
| 2009/0301211 | A1 * | 12/2009 | Yoshikawa et al. ............. 73/724 |
| 2010/0126834 | A1 * | 5/2010 | Ikehashi ......................... 200/181 |
| 2010/0314669 | A1 * | 12/2010 | Huang ............................ 257/254 |
| 2011/0277286 | A1 * | 11/2011 | Zhang ........................... 29/25.35 |

FOREIGN PATENT DOCUMENTS

JP    2000-131173    5/2000

* cited by examiner

*Primary Examiner* — Allen Parker

(74) *Attorney, Agent, or Firm* — Oblon, Spivak, McClelland, Maier & Neustadt, L.L.P.

(57) ABSTRACT

According to one embodiment, a MEMS element comprises a first electrode that is fixed on a substrate and has plate shape, a second electrode that is disposed above the first electrode while facing the first electrode, the second electrode being movable in a vertical direction and having plate shape, and a first film that includes a first cavity in which the second electrode is accommodated on the substrate. The second electrode is connected to an anchor portion connected to the substrate via a spring portion. An upper surface of the second electrode is connected to the first film.

32 Claims, 10 Drawing Sheets

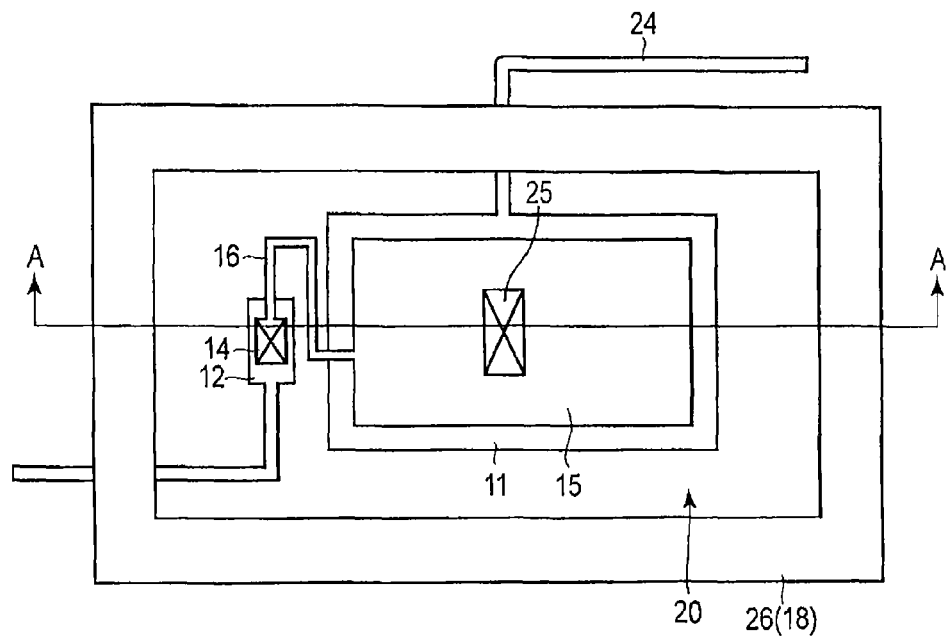
F I G. 1A
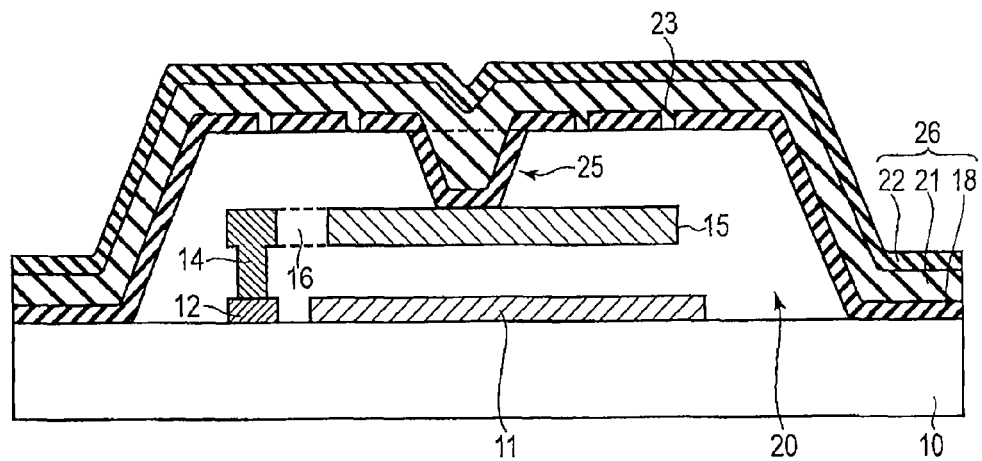
F I G. 1B

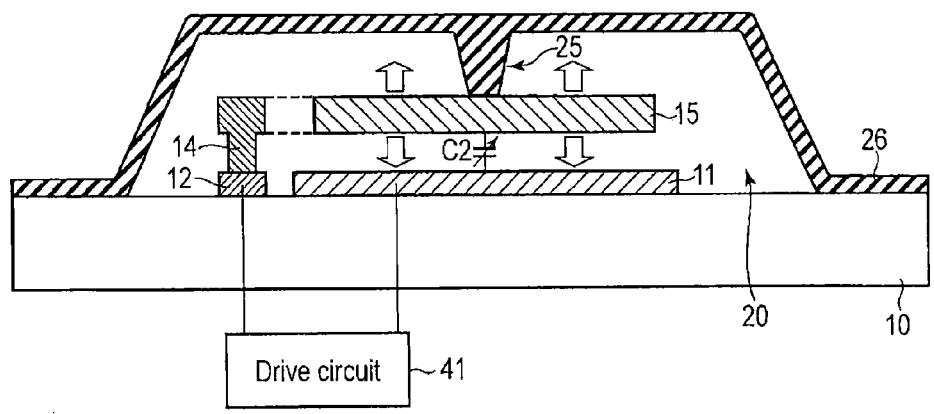
F I G. 3
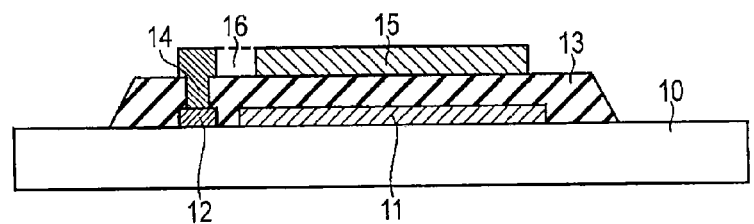
F I G. 4A
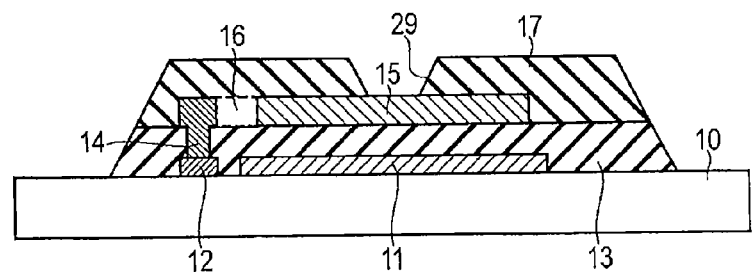
F I G. 4B

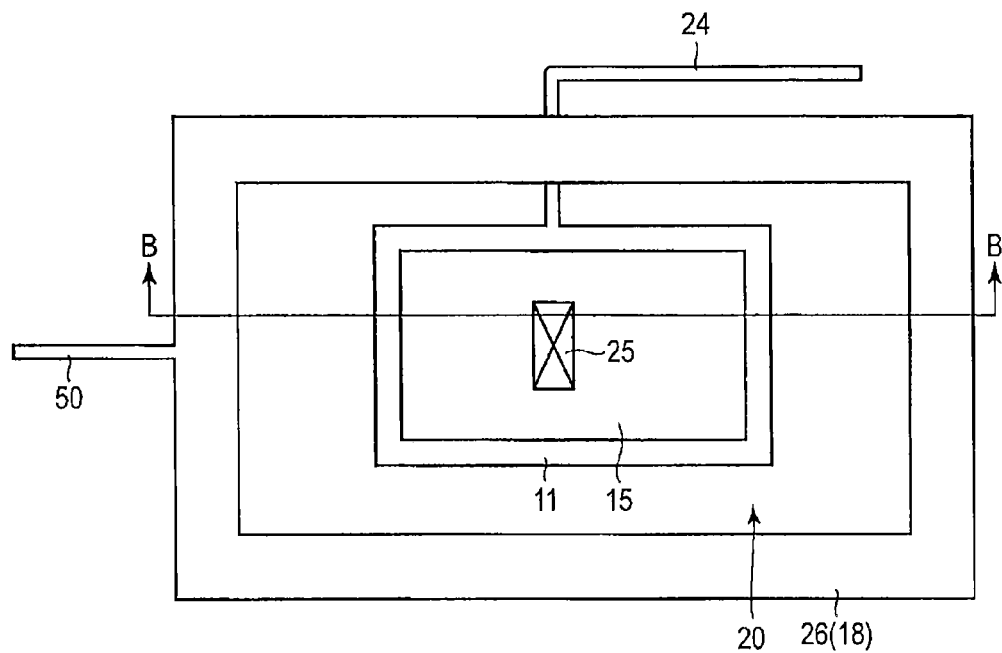
F I G. 5A
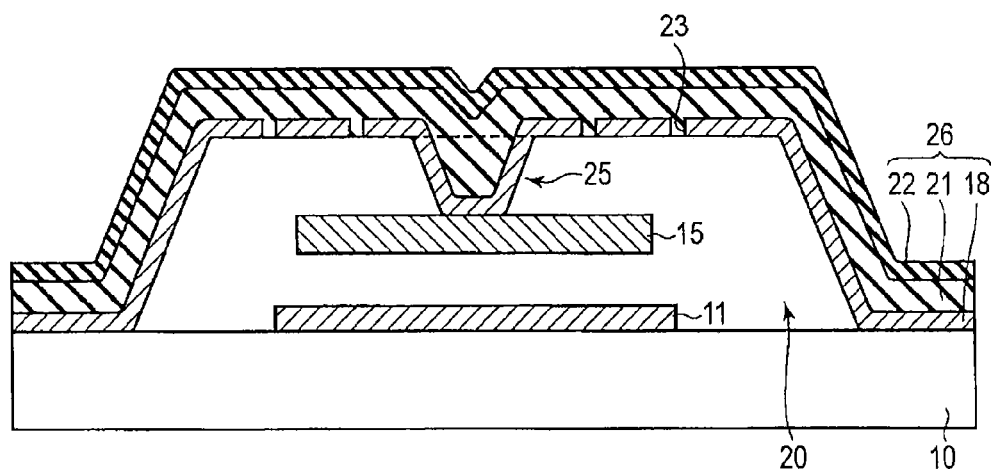
F I G. 5B

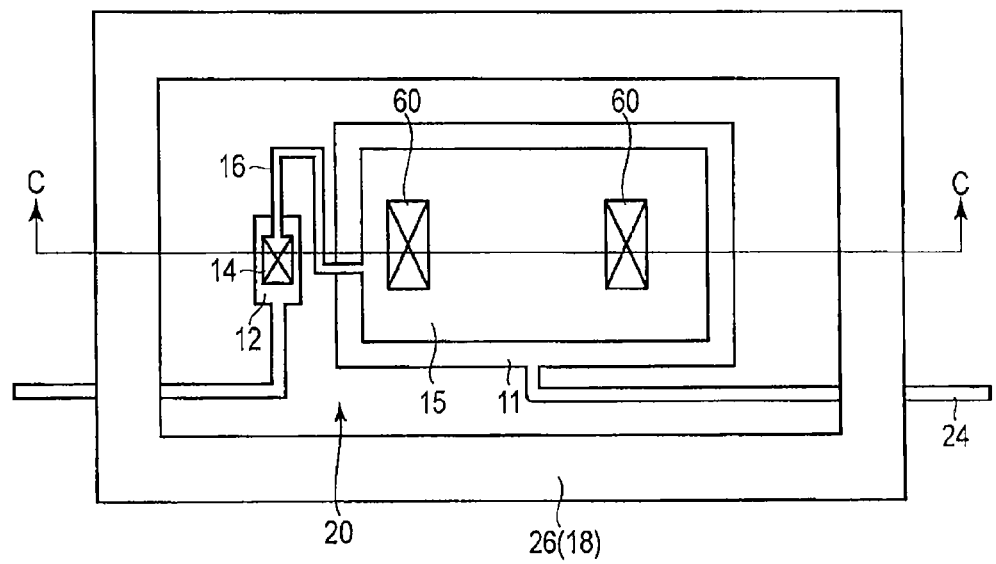
F I G. 6A
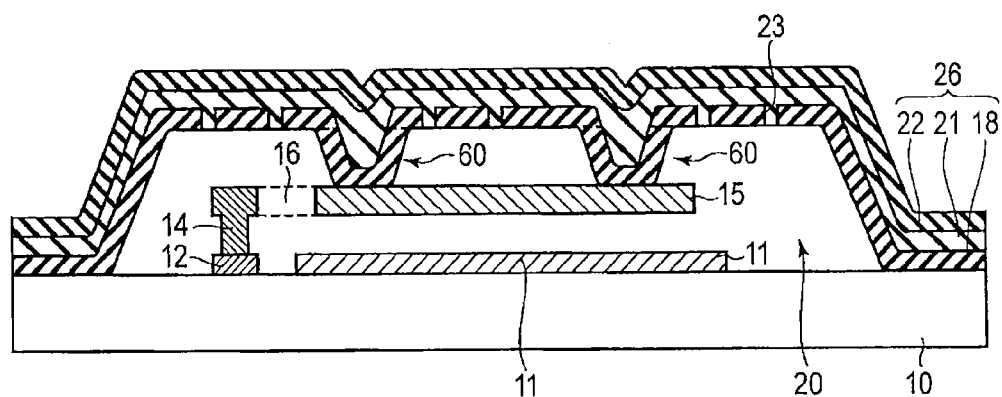
F I G. 6B

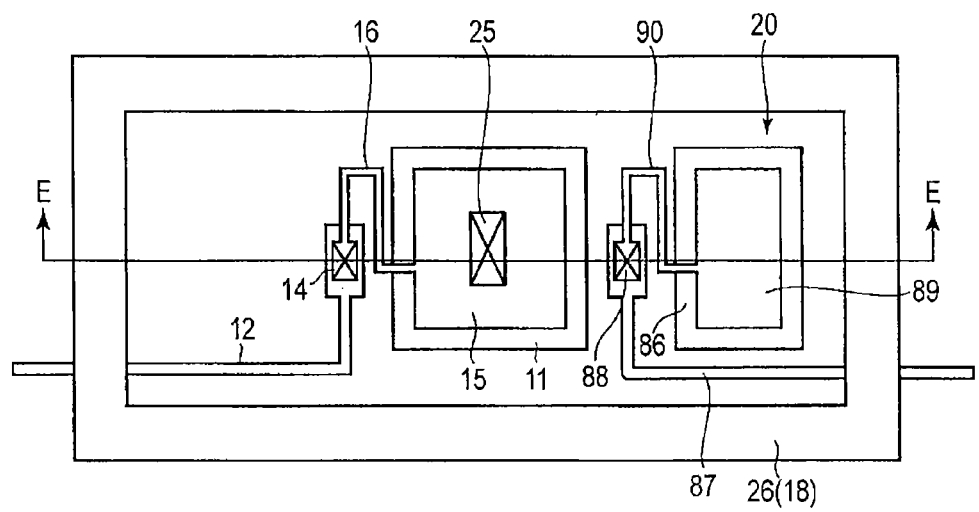
F I G. 8A
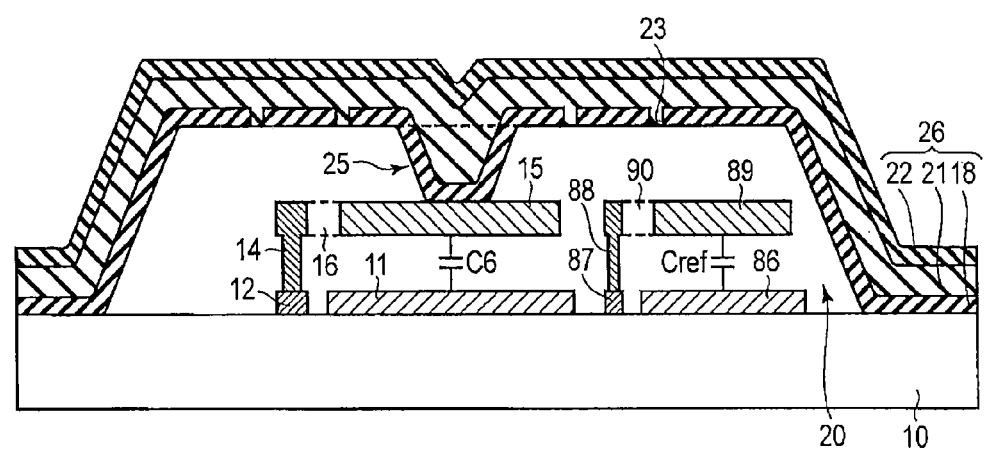
F I G. 8B

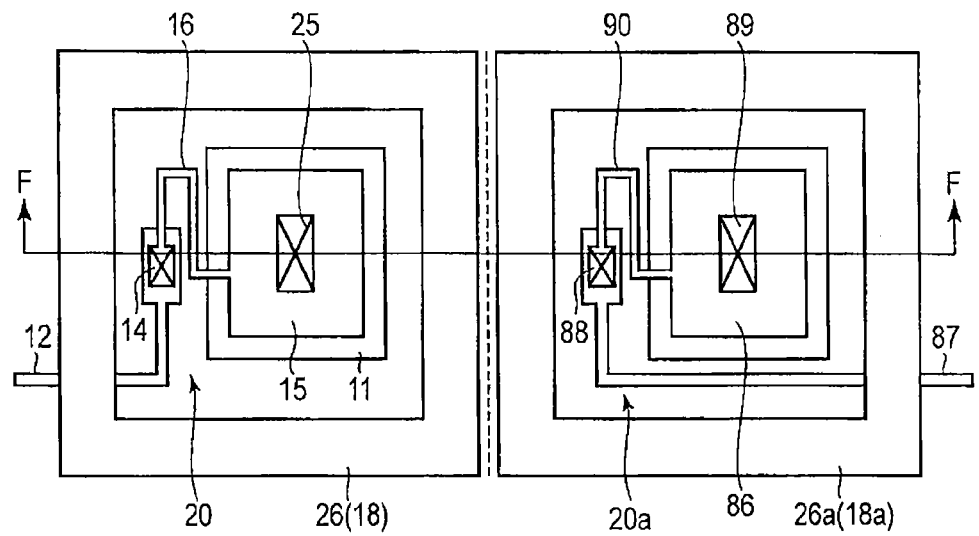
F I G. 9A
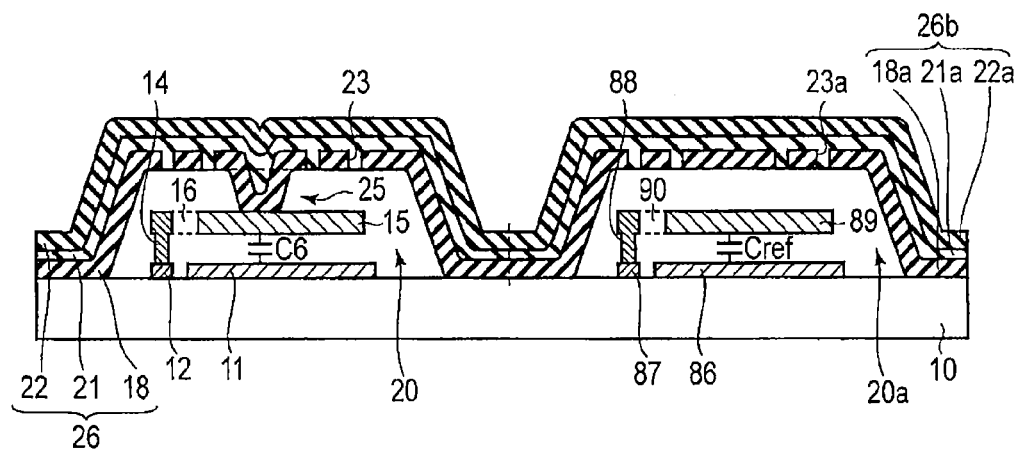
F I G. 9B

MEMS ELEMENT

CROSS-REFERENCE TO RELATED APPLICATIONS

This application is based upon and claims the benefit of priority from Japanese Patent Application No. 2011-247284, filed Nov. 11, 2011, the entire contents of which are incorporated herein by reference.

FIELD

Embodiments described herein relate generally to a MEMS element.

BACKGROUND

There has been proposed a Micro-electromechanical system (MEMS) element including a mechanically movable unit. For example, the MEMS element can be applied to devices, such as a pressure sensor, a variable capacitor, and a micropump.

For example, in the case that the MEMS element is used as the pressure sensor, the MEMS element includes a fixed electrode and a movable thin-film dome (movable electrode). The pressure sensor measures a pressure at that time by detecting the capacitance (electrostatic capacitance) between the movable thin-film dome and the fixed electrode according to the pressure outside of the dome.

At this point, a large movement is generated in a central portion of the thin-film dome while a small movement is generated in an end portion. Therefore, the end portion of the thin-film dome does not contribute to the capacitance change between the thin-film dome and the fixed electrode too much compared with the central portion. In other words, only the central portion of the thin-film dome contributes to the capacitance change. As a result, the capacitance change between the thin-film dome and the fixed electrode is small for the external pressure, and the pressure sensor has poor sensitivity.

In the MEMS element, there is a demand to enhance the sensitivity as the pressure sensor to improve reliability.

BRIEF DESCRIPTION OF THE DRAWINGS

FIG. 1A is a plan view illustrating a structure of a MEMS element according to a first embodiment;

FIG. 1B is a sectional view illustrating the structure of the MEMS element of the first embodiment;

FIG. 3 is a view illustrating an example in which the MEMS element of the first embodiment is applied to a variable capacitor;

FIGS. 4A, 4B, 4C, 4D, and 4E are views illustrating a process of manufacturing the MEMS element of the first embodiment;

FIG. 5A is a plan view illustrating a structure of a MEMS element according to a second embodiment;

FIG. 5B is a sectional view illustrating the structure of the MEMS element of the second embodiment;

FIG. 6A is a plan view illustrating a structure of a MEMS element according to a third embodiment;

FIG. 6B is a sectional view illustrating the structure of the MEMS element of the third embodiment;

FIG. 8A is a plan view illustrating a structure of a MEMS element according to a fifth embodiment;

FIG. 8B is a sectional view illustrating the structure of the MEMS element of the fifth embodiment;

FIG. 9A is a plan view illustrating a structure of a MEMS element according to a modification of the fifth embodiment;

FIG. 9B is a sectional view illustrating the structure of the MEMS element of the modification of the fifth embodiment;

DETAILED DESCRIPTION

Figure 1C:
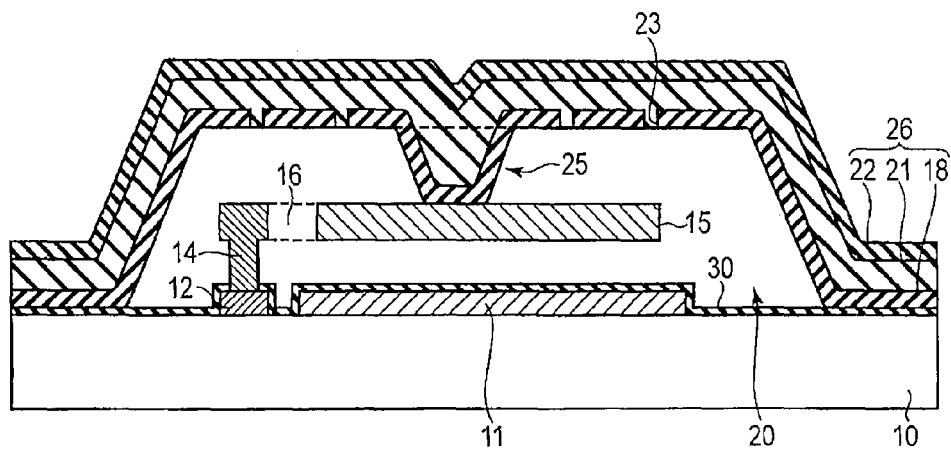
FIG. 1C is a sectional view illustrating a structure of a MEMS element according to a modification of the first embodiment.

In general, according to one embodiment, a MEMS element comprises a first electrode that is fixed on a substrate and has plate shape, a second electrode that is disposed above the first electrode while facing the first electrode, the second electrode being movable in a vertical direction and having plate shape, and a first film that includes a first cavity in which the second electrode is accommodated on the substrate. The second electrode is connected to an anchor portion connected to the substrate via a spring portion. An upper surface of the second electrode is connected to the first film.

Hereinafter embodiments will be described with reference to the drawings. In the following drawings, the identical component is designated by the identical numeral. The overlapping description is made as needed basis.

First Embodiment

A MEMS element according to a first embodiment will be described with reference to FIGS. 1A, 1B, 1C, 2, 3, 4A, 4B, 4C, 4D, and 4E. In the first embodiment, by way of example, an upper electrode 15 that is of a movable electrode is supported by an anchor portion 14 disposed on a substrate 10 while a spring portion 16 is interposed between the upper electrode 15 and the anchor portion 14, and the upper electrode 15 is also supported by an anchor portion 25 connected to a thin-film dome 26. Therefore, the upper electrode 15 can work with the thin-film dome 26 to increase the capacitance change between the upper electrode 15 and a lower electrode 11. The first embodiment will be described in detail below.

[Structure]

A structure of the MEMS element of the first embodiment will be described below with reference to FIGS. 1A, 1B, and 1C.

FIG. 1A is a plan view illustrating the structure of the MEMS element of the first embodiment. FIG. 1B is a sectional view illustrating the structure of the MEMS element of the first embodiment, and a sectional view taken on a line A-A of FIG. 1A.

As illustrated in FIGS. 1A and 1B, the MEMS element of the first embodiment includes the lower electrode 11 the upper electrode 15, and the thin-film dome 26 that are formed on the substrate 10.

The substrate 10 is an inter-layer insulator that is provided on an insulating substrate, such as glass, or a silicon substrate. In the case that the substrate 10 is the inter-layer insulator provided on the silicon substrate, elements, such as a transistor, may be provided on a surface of the silicon substrate. The elements constitute a logic circuit or a storage circuit. The inter-layer insulator is provided on the silicon substrate so as to cover the circuits. That is, the MEMS element is provided above the circuits on the silicon substrate.

A shield metal may be provided in the inter-layer insulator to prevent a noise from the lower-layer circuit from propagating to the MEMS element. Desirably the inter-layer insulator on the silicon substrate is made of a low-dielectric material in order to reduce a parasitic capacitance of the inter-layer insulator. For example, tetra-ethyl ortho-silicate (TEOS) is used as the inter-layer insulator. Desirably a thickness of the inter-layer insulator is increased in order to reduce the parasitic capacitance.

The lower electrode 11 is formed on and fixed on the substrate 10. The lower electrode 11 is formed into a plate shape parallel to a surface of the substrate 10. For example, the lower electrode 11 is made of aluminum (Al), an alloy mainly containing aluminum, copper (Cu), gold (Au), or platinum (Pt). The lower electrode 11 is connected to an interconnection 24 made of the same material as the lower electrode 11, and the lower electrode 11 is connected to various circuits through the interconnection 24.

The upper electrode 15 is formed above the lower electrode 11. The upper electrode 15 is formed into a plate shape parallel to the surface of the substrate 10, and disposed facing the lower electrode 11. That is, the upper electrode 15 overlaps the lower electrode 11 in a plane (a plane parallel to the surface of the substrate 10, hereinafter simply referred to as a plane) that spreads in a first direction (the horizontal direction in FIG. 1A) and a second direction (the vertical direction in FIG. 1A) orthogonal to the first direction. In FIG. 1A, a planar size (for example, an area) of the upper electrode 15 is smaller than that of the lower electrode 11. Alternatively, the planar size of the upper electrode 15 may be equal to or larger than that of the lower electrode 11. In FIG. 1A, the lower electrode 11 and the upper electrode 15 have a rectangular shape when viewed from above. Alternatively, the lower electrode 11 and the upper electrode 15 have a circular shape or an ellipsoidal shape.

For example, the upper electrode 15 is made of Al, an alloy mainly containing Al, Cu, Au, or Pt. That is, the upper electrode 15 is made of a ductile material. The ductile material means a material that, when a member made of the ductile material is fractured by applying a stress to the member, the member is fractured after the member generates a large plastic deformation (ductility). In the case that the MEMS element is applied to the pressure sensor, the upper electrode 15 and the lower electrode 11 may be made of doped silicon to which an impurity is introduced.

The upper electrode 15 is movable in a direction (vertical direction) perpendicular to the surface of the substrate 10. That is, the capacitance between the upper electrode 15 and the lower electrode 11 is changed according to a change in distance between the upper electrode 15 and the lower electrode 11.

Various connection relationships of the upper electrode 15 of the first embodiment are described in detail later.

The thin-film dome 26 includes a cavity 20 that accommodates the lower electrode 11 and the upper electrode 15. In other words, the lower electrode 11 and the upper electrode 15 are formed in the cavity 20. The cavity 20 is maintained in a dry atmosphere or a vacuum atmosphere. Therefore, a harmful gas, such as moisture, is prevented from degrading the lower electrode 11 and the upper electrode 15, and degradation of a characteristic of the MEMS element is prevented.

The thin-film dome 26 is constructed by a first layer 18, a second layer 21, and a third layer 22, which are sequentially stacked from the inside.

The first layer 18 includes through-holes (openings) 23. The through-holes 23 are used to form the cavity 20 such that the sacrificial layers 13 and 17 are removed by etching in a later production process. That is, the sacrificial layers 13 and 17 are etched through the through-holes 23.

For example, the first layer 18 is made of a brittle insulating material. The brittle material means a material that, when a member made of the brittle material is fractured by applying stress to the member, there is substantially no plastic deformation (shape change). Generally, the energy (stress) necessary to fracture a member made of a brittle material is less than the energy necessary to fracture a member made of a ductile material. That is, a member made of a brittle material is easily fractured compared with a member made of a ductile material. In other words, a brittle material is a hard (high-stiffness) material in which the shape is barely changed. As used herein, a hard material means a material having a high Young's modulus.

The first layer 18 consists of a brittle insulating material such as silicon oxide (SiO or $SiO_2$) or silicon nitride (SiN).

Note that the first layer 18 may consist of a brittle conductive material such as WSi or AlSi.

The second layer 21 is formed on the first layer 18 to close the through-holes 23. The second layer 21 has a function of sealing the cavity 20, discharging the harmful gas in the cavity 20 by permeation, and adjusting the atmosphere of the cavity 20.

Desirably the second layer 21 consists of an application film of an organic material, such as polyimide. Even if the through-hole 23 has a large-size diameter or opening area, the through-hole 23 can easily and surely be closed. Accordingly, there is no limitation to the size and the disposition of the through-hole 23. Therefore, a sacrificial layer can surely be etched for a short time by disposing the plural through-holes 23 having the large sizes.

The second layer 21 is not limited to an application film of an organic material. The second layer 21 may consist of an insulating film such as SiO ($SiO_2$) or SiN.

The third layer 22 is formed on the second layer 21. The third layer 22 acts as a moisture-proof film that prevents the moisture in the atmosphere from permeating the second layer 21 to invade in the cavity 20. Desirably the third layer 22 consists of a brittle insulating material such as SiN.

In the thin-film dome 26, the second layer 21 is a material having low stiffness. The first layer 18 and/or the third layer 22 are a material having high stiffness. Therefore, a spring constant (hereinafter simply referred to as a spring constant) for a vertical displacement in the whole thin-film dome 26 is determined by the brittle material used in the first layer 18 and/or the third layer 22. Creep of the thin-film dome 26 can be suppressed by increasing the spring constant of the thin-film dome 26. Creep refers to a phenomenon in which a secular change is increased or in which deformation (shape change) of the member is increased when stress is applied to the member.

In the first embodiment, the spring constant of the thin-film dome 26 is configured so as to be larger than that of the spring portion 16. The spring constant of the thin-film dome 26 is configured so as to be larger than that of the upper electrode 15.

The thin-film dome 26 is not limited to the first layer 18, the second layer 21, or the third layer 22. For example, a silicon cap formed in another process may be used as the thin-film dome 26.

The various connection relationships of the upper electrode 15 of the first embodiment will be described in detail below.

One end of the spring portion 16 is connected to an end portion in the plane of the upper electrode 15. The spring portion 16 and the upper electrode 15 are integrally formed. For example, the spring portion 16 is made of the same conductive material as the upper electrode 15. That is, although the spring portion 16 is made of a brittle conductive material, the spring portion 16 is not limited to a brittle conductive material. The spring portion 16 may be made of a material different from the upper electrode 15. The spring portion 16 and the upper electrode 15 constitute a single-layer structure in which the spring portion 16 and the upper electrode 15 are unified, and the spring portion 16 has a meander shape in the plane. In other words, the spring portion 16 is formed into a long, thin, and winding shape in the plane. The spring constant of the spring portion 16 is smaller than that of the upper electrode 15 by properly setting at least one of a line width, a thickness, and a curvature of the spring portion 16. The spring constant of the spring portion 16 is smaller than that of the thin-film dome 26.

The anchor portion 14 is connected to the other end of the spring portion 16. That is, the upper electrode 15 is supported with the spring portion 16 interposed therebetween. The anchor portion 14 and the spring portion 16 are integrally formed, and made of the same conductive material. That is, although the anchor portion 14 is made of a brittle conductive material, the anchor portion 14 is not limited to a brittle conductive material. The anchor portion 14 may be made of a material different from the upper electrode 15 and the spring portion 16. The anchor portion 14 is connected to an interconnection 12 disposed on the substrate 10. The interconnection 12 is formed at the level of the lower electrode 11, and made of the same conductive material as the lower electrode 11. The upper electrode 15 is electrically connected to the interconnection 12 through the spring portion 16 and the anchor portion 14, and connected to various circuits.

The central portion in the plane of the upper electrode 15 is supported by the anchor portion 25 located above the upper electrode 15. In other words, an upper surface of the upper electrode 15 contacts the anchor portion 25. The anchor portion 25 and the thin-film dome 26 are integrally formed, and the anchor portion 25 is made of the same material as the thin-film dome 26. In other words, the anchor portion 25 projects downward from the thin-film dome 26. That is, the upper electrode 15 is connected to the thin-film dome 26 through the anchor portion 25. Desirably the anchor portion 25 is formed in the central portion in the plane of the thin-film dome 26. However, the position of the anchor portion 25 is not limited to the central portion of the thin-film dome 26.

An area (an area in the plane of the anchor portion 25) of central portion in the plane of the thin-film dome 26 is smaller than an area in the plane of the upper electrode 15. For example, the anchor portion 25 has the rectangular shape in the plane. Alternatively, the anchor portion 25 may be formed into a circular or ellipsoidal shape.

Thus, the anchor portion 25 is connected to the upper electrode 15, whereby the vertical movement of the thin-film dome 26 is linked to the vertical movement of the upper electrode 15. At this point, because the anchor portion 25 is formed in the central portion in the plane of the thin-film dome 26, the upper electrode 15 works with the movement of the central portion of the thin-film dome 26. The central portion of the thin-film dome 26 moves greatly compared with the end portion. That is, the upper electrode 15 moves vertically while working with the greatly moving central portion of the thin-film dome 26.

It is not always necessary that the upper electrode 15 is not directly connected to the anchor portion 25. The upper electrode 15 may be hung from the anchor portion 25 with a member (not illustrated) interposed therebetween so as to work with the vertical movement of the thin-film dome 26.

The spring constant of the thin-film dome 26 is sufficiently larger than that of the spring portion 16, so that the vertical movement of the thin-film dome 26 can substantially be linked to the upper electrode 15 irrespective of the existence of the spring portion 16. That is, the distance and the capacitance between the upper electrode 15 and the lower electrode 11 can be controlled by controlling the movement of the thin-film dome 26. The spring constant of the upper electrode 15 is sufficiently larger than that of the spring portion 16, so that a parallel state between the upper electrode 15 and the lower electrode 11 can be maintained when the thin-film dome 26 moves vertically.

FIG. 10 is a sectional view illustrating a structure of a MEMS element according to a modification of the first embodiment.

As illustrated in FIG. 10, an insulating film 30 may be formed on the surface of the lower electrode 11. For example, the insulating film 30 consists of SiN or SiO ($SiO_2$). Alternatively, the insulating film 30 may consist of any of various insulating materials. A shortcircuit caused by the contact between the lower electrode 11 and the upper electrode 15 can be prevented by forming the insulating film 30 on the surface (the surface facing the upper electrode 15, the upper surface) of the lower electrode 11.

The insulating film 30 may be formed on the surface (the surface facing the lower electrode 11, the lower surface) of the upper electrode 15 instead of the upper surface of the lower electrode 11.

[Movement]

The movement of the MEMS element of the first embodiment will be described below with reference to FIGS. 2 and 3.

Figure 2:
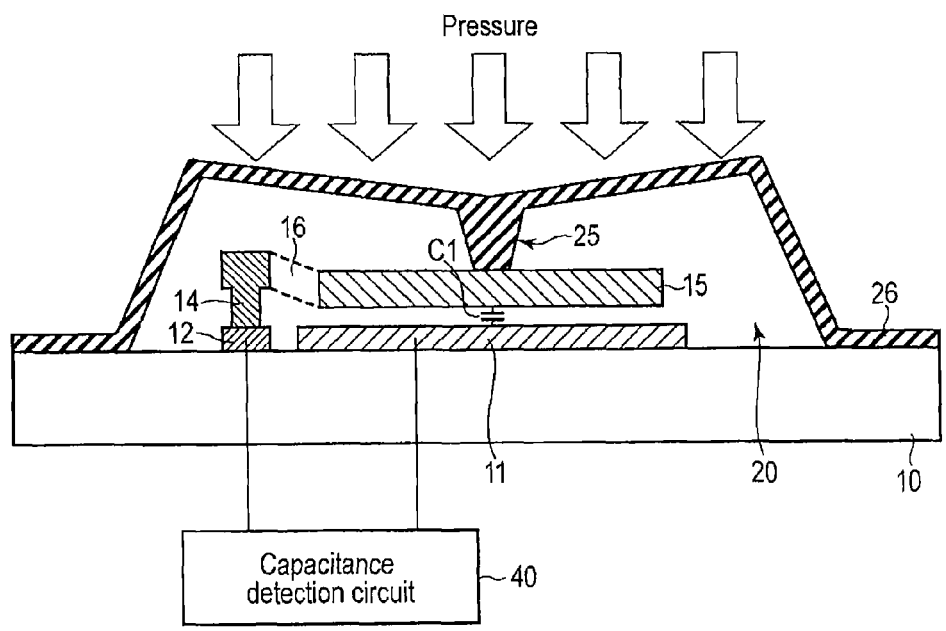
FIG. 2 is a view illustrating an example in which the MEMS element of the first embodiment is applied to a pressure sensor.

FIG. 2 is a view illustrating an example in which the MEMS element of the first embodiment is applied to a pressure sensor. FIG. 3 is a view illustrating an example in which the MEMS element of the first embodiment is applied to a variable capacitor. The stacked structure of the thin-film dome 26 is omitted in FIGS. 2 and 3.

In the MEMS element of the first embodiment, the lower electrode 11 is connected to various circuits through the interconnection 24, and the upper electrode 15 is connected to the interconnection 12 through the spring portion 16 and the anchor portion 14 and connected to the various circuits.

Therefore, in the first embodiment, the capacitance (electrostatic capacitance) between the upper electrode 15 and the lower electrode 11 is changed according to the change in distance between the upper electrode 15 and the lower electrode 11, which allows the MEMS element to be applied to various devices.

As illustrated in FIG. 2, in the case that the MEMS element is applied to the pressure sensor, the MEMS element is connected to a capacitance detection circuit 40 that detects the capacitance between the upper electrode 15 and the lower electrode 11.

More specifically, one end of the capacitance detection circuit 40 is connected to the interconnection 12, and the other end is connected to the interconnection 24. That is, in the capacitance detection circuit 40, one end is electrically connected to the upper electrode 15 through the interconnection 12, the anchor portion 14, and the spring portion 16, and the other end is electrically connected to the lower electrode 11 through the interconnection 24. The capacitance detection circuit 40 is mounted on the same chip as the MEMS element. However, there is no limitation to the method for mounting the capacitance detection circuit 40. For example, one pressure sensor including the capacitance detection circuit 40 and the MEMS element is disposed in the chip.

When a pressure is applied from the outside of the thin-film dome 26, the thin-film dome 26 is deformed by a pressure difference between the inside and outside of the thin-film dome 26. In the case that the pressure of the outside is larger than that of the inside, the central portion of the thin-film dome 26 dimples (moves downward), and the upper electrode 15, which is connected to the thin-film dome 26 through the anchor portion 25, works with the thin-film dome 26 to move downward. Therefore, the distance between the upper electrode 15 and the lower electrode 11 is shortened, namely, a capacitance C1 between the upper electrode 15 and the lower electrode 11 is increased. The pressure of the outside is measured by detecting capacitance C1.

According to the first embodiment, because the upper electrode 15 is connected to the central portion of the thin-film dome 26 through the anchor portion 25, the upper electrode 15 moves vertically by reflecting the local deformation of the central portion of the thin-film dome 26. Therefore, the upper electrode 15 having the area larger than that of the central portion of the thin-film dome 26 moves vertically while maintaining the parallel state with respect to the lower electrode 11, so that the capacitance can be amplified.

According to the first embodiment, when the large pressure is applied to the thin-film dome 26 from the outside, the upper electrode 15 contacts the lower electrode 11. That is, the upper electrode 15 acts as a stopper, which can prevent the destruction of the thin-film dome 26 when the large pressure is applied.

On the other hand, as illustrated in FIG. 3, in the case that the MEMS element is applied to the variable capacitance, the MEMS element is connected to a drive circuit 41 that applies a voltage to the upper electrode 15 and the lower electrode 11.

More specifically, one end of the drive circuit 41 is connected to the interconnection 12, and the other end is connected to the interconnection 24. That is, in the drive circuit 41, one end is electrically connected to the upper electrode 15 through the interconnection 12, the anchor portion 14, and the spring portion 16, and the other end is connected to the lower electrode 11 through the interconnection 24. The drive circuit 41 is mounted on the same chip as the MEMS element. However, there is no limitation to the method for mounting the drive circuit 41.

When the drive circuit 41 applies the voltage to the upper electrode 15 and the lower electrode 11, a potential difference is generated between the upper electrode 15 and the lower electrode 11, and the upper electrode 15 moves vertically by an electrostatic attractive force. Therefore, the distance between the upper electrode 15 and the lower electrode 11 is changed to change a capacitance C2 between the upper electrode 15 and the lower electrode 11. That is, the drive circuit 41 can change capacitance C2 between the upper electrode 15 and the lower electrode 11 by applying the voltage to the upper electrode 15 and the lower electrode 11.

According to the first embodiment, an overlapping area is enlarged between the upper electrode 15 and the lower electrode 11, which are of the capacitance electrodes, so that a drive voltage can be decreased. The thin-film dome 26 includes the brittle material, and the stiffness (spring constant) of the thin-film dome 26 depends on the brittle material.

Therefore, creep deformation of the thin-film dome 26 is not produced even if stress is applied for a long time.

The MEMS element can also be used as a micropump by connecting the drive circuit 41. That is, the drive circuit 41 applies the voltage to the upper electrode 15 and the lower electrode 11, and the upper electrode 15 vertically moves by the electrostatic attractive force. The thin-film dome 26 connected to the upper electrode 15 moves vertically in conjunction with the vertical movement of the upper electrode 15. The voltage applied by the drive circuit 41 is changed to vertically move the thin-film dome 26, whereby the MEMS element acts as the micropump.

[Manufacturing Method]

A method of manufacturing the MEMS element of the first embodiment will be described below with reference to FIGS. 4A, 4B, 4C, 4D, and 4E.

FIGS. 4A, 4B, 4C, 4D, and 4E are views illustrating a process of manufacturing the MEMS element of the first embodiment.

As illustrated in FIG. 4A, a conductive layer is formed on the substrate 10 and patterned. Therefore, the lower electrode 11 is formed on the substrate 10. For example, the lower electrode 11 is made of Al, an alloy mainly containing Al, Cu, Au, or Pt. The thickness of the lower electrode 11 ranges from several hundred nanometers to several micrometers. A sputtering method is used as a method for depositing the lower electrode 11. As for the patterning method, conventional photolithography and reactive ion etching (RIE), or photolithography and wet etching, may be used.

At the same time, the interconnections 12 and 24 are formed on the substrate 10. Therefore, the interconnections 12 and 24 are made of the same material as the lower electrode 11. Alternatively, the interconnections 12 and 24 may be formed in a process different from the lower electrode 11 with a different material.

Then, the insulating film 30 may be formed by CVD so as to cover the surface of the lower electrode 11. At this point, the surface of the interconnection 12 is also covered with the insulating film 30. However, an opening is formed in the insulating film 30 such that the surface of the interconnection 12 is partially exposed.

Then, the first sacrificial layer 13 made of an organic material, such as polyimide, is applied so as to partially cover the lower electrode 11 and the interconnection 12. For example, the thickness of the first sacrificial layer 13 ranges from several hundred nanometers to several micrometers.

Then, the first sacrificial layer 13 is patterned into the desired shape. Therefore, the surface of the interconnection 12 is partially exposed. The first sacrificial layer 13 may be patterned by photosensitive exposure and development. The first sacrificial layer 13 may be patterned by the RIE method using a resist pattern (not illustrated), which is formed on the first sacrificial layer 13 by a usual lithography method. Alternatively, a SiO film (not illustrated) formed on the first sacrificial layer 13 is patterned as a hard mask by the RIE method or the wet etching method using the resist pattern formed by the usual lithography method, and the first sacrificial layer 13 may be patterned using the hard mask.

Then, a conductive layer is formed on the first sacrificial layer 13 and patterned. Therefore, the upper electrode 15 is formed on the first sacrificial layer 13. For example, the upper electrode 15 is made of Al, an alloy mainly containing Al, Cu, Au, or Pt. The thickness of the lower electrode 11 ranges from several hundred nanometers to several micrometers. The sputtering method is used as the method for depositing the upper electrode 15. As to the patterning method, the conventional photolithography method and RTE method may be used, or the photolithography method and the wet etching method may be used.

At the same time, the spring portion 16 and the anchor portion 14 are formed on the first sacrificial layer 13. Therefore, the upper electrode 15 is connected to the interconnection 12 through the spring portion 16 and the anchor portion 14. The spring portion 16 and the anchor portion 14 are made of the same material as the upper electrode 15. Alternatively, the spring portion 16 and the anchor portion 14 may be formed in a process different from the upper electrode 15 with a different material.

As illustrated in FIG. 4B, the second sacrificial layer 17 made of an organic material, such as polyimide, is applied so as to cover the upper electrode 15, the spring portion 16, the anchor portion 14, and the first sacrificial layer 13. For example, the thickness of the second sacrificial layer 17 ranges from several hundred nanometers to several micrometers.

Then, the second sacrificial layer 17 is patterned into the desired shape. The second sacrificial layer 17 may be patterned by the photosensitive exposure and the development. The second sacrificial layer 17 may be patterned by the RIE method using a resist pattern (not illustrated), which is formed on the second sacrificial layer 17 by the usual lithography method. Alternatively, a SiO film (not illustrated) formed on the second sacrificial layer 17 is patterned as the hard mask by the RIE method or the wet etching method using the resist pattern formed by the usual lithography method, and the second sacrificial layer 17 may be patterned using the hard mask.

At this point, the second sacrificial layer 17 located on the central portion of the upper electrode 15 in the plane is partially patterned and removed. Therefore, an opening 29 piercing the second sacrificial layer 17 is formed to expose the central portion in the plane of the upper electrode 15.

Figure 4C:
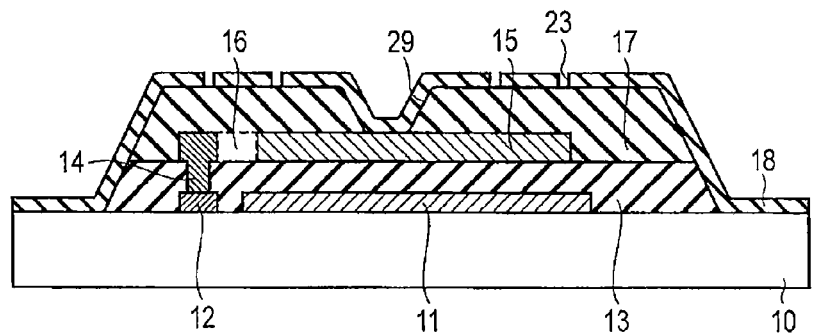

As illustrated in FIG. 4C, the first layer 18 is formed so as to cover the second sacrificial layer 17. For example, the thickness of the first layer 1B ranges from several hundred nanometers to several micrometers. The first layer 18 consists of a brittle insulating material such as SiN or SiO ($SiO_2$). CVD is used as the method for depositing the first layer 18.

At this point, the first layer 18 is also formed on an inner surface of the opening 29. That is, the first layer 18 is formed while contacting the upper surface of the upper electrode 15, which is exposed through the opening 29, thereby obtaining the structure in which thin-film dome 26 is connected to the upper electrode 25. At this point, the opening 29 is not necessarily buried by the first layer 18.

A resist (not illustrated) is applied to the first layer 18. Then, using the resist pattern (not illustrated) formed by the usual lithography method, the plural through-holes 23 are made in the first layer 18 in order to remove the first sacrificial layer 13 and the second sacrificial layer 17 by the RIE method or the wet etching method.

At this point, desirably the through-hole 23 is made by adjusting a selection ratio of the resist pattern (not illustrated) and the first layer 18 such that a diameter of the through-hole 23 is gradually increased from the outside toward the inside. In other words, desirably the through-hole 23 is tapered such that the diameter is gradually decreased from the outside toward the inside. This is because a sealing characteristic of the through-hole 23 is improved after the first sacrificial layer 13 and the second sacrificial layer 17 are removed in a post-process.

Figure 4D:
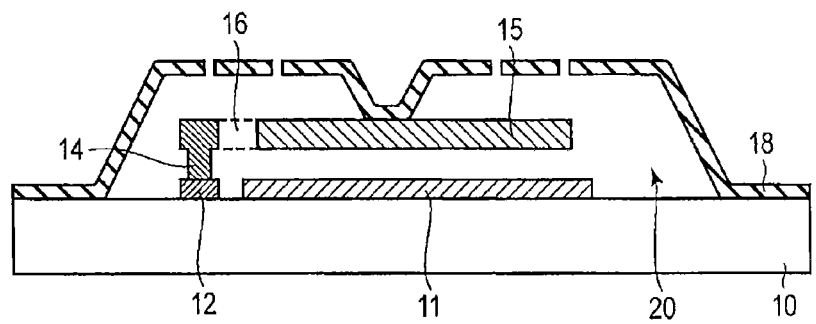

As illustrated in FIG. 4D, the resist pattern (not illustrated), the first sacrificial layer 13, and the second sacrificial layer 17 are removed by ashing in which an $O_2$ gas is used. Therefore, the cavity 20 constituting a moving space of the upper electrode 15 that is of the movable electrode is formed.

Figure 4E:
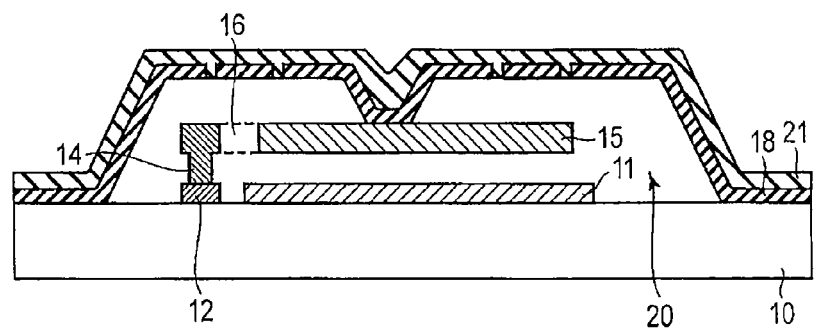

As illustrated in FIG. 4E, the second layer 21 is formed on the first layer 18. Therefore, the through-holes 23 are closed to seal the cavity 20. For example, the thickness of the second layer 21 ranges from several hundred nanometers to several micrometers. The second layer 21 consists of an organic material such as polyimide, or of SiN or of SiO ($SiO_2$). For example, when it consists of an organic material such as polyimide, the second layer 21 is formed by the application method. When it consists of SiN or SiO ($SiO_2$), the second layer 21 is formed by the CVD method. At this point, the opening 29 may not necessarily buried by the second layer 21.

As illustrated in FIG. 1B, the third layer 22 is formed as the moisture-proof film on the second layer 21. For example, the thickness of the third layer 22 ranges from several hundred nanometers to several micrometers. For example, the third layer 22 is made of SiN. The CVD method is used as the method for depositing the third layer 22.

Then, the third layer 22 is patterned into the desired shape. The third layer 22 is patterned by the RIE method or the wet etching method using the resist pattern (not illustrated) formed by the usual lithography method. Thus, the MEMS element of the first embodiment is formed.

[Effect]

According to the first embodiment, in the MEMS element, the upper electrode 15 that is of the movable electrode is connected to the substrate 10 through the spring portion 16 and the anchor portion 14 and connected to the central portion in the plane of the thin-film dome 26, which is located above the upper electrode 15, through the anchor portion 25. The thin-film dome 26 is made of a brittle material having greater stiffness than that of the upper electrode 15. Therefore, the following effects can be obtained.

In the case that the MEMS element is applied to the pressure sensor, the central portion of the thin-film dome 26 moves vertically larger than the end portion. In the first embodiment, the upper electrode 15 is connected to the central portion of the thin-film dome 26 through the anchor portion 25. Therefore, the upper electrode 15 moves vertically in conjunction with the movement of the central portion of the thin-film dome 26. That is, the upper electrode 15, which has the area larger than that of the central portion of the thin-film dome 26, moves vertically in parallel by reflecting the movement of the central portion of the thin-film dome 26. The capacitance between the upper electrode 15 and the lower electrode 11 is detected. Accordingly, the change of capacitance can be greatly amplified compared with the case that the capacitance between the fixed electrode and the thin-film dome as the movable electrode is measured.

As a result, the sensitivity can be enhanced as the pressure sensor to improve the reliability.

In the case that the large pressure is applied to the thin-film dome 26 from the outside, the upper electrode 15 contacts the lower electrode 11. Even if the large pressure is further applied from the contact state, the thin-film dome 26 is not deformed any more. That is, the upper electrode 15 acts as the stopper, which can prevent the destruction of the thin-film dome 26 when the large pressure is applied.

On the other hand, in the case that the MEMS element is applied to the variable capacitance or the micropump, the voltage is applied to the upper electrode 15 and the lower electrode 11, and the upper electrode 15 is vertically moved by the electrostatic attractive force generated at that time. In the first embodiment, upper electrode 15 that is of the movable electrode has the larger area compared with the case that the thin-film dome is used as the movable electrode. Thus, in the first embodiment, the overlapping area between the upper electrode 15 and the lower electrode 11 can be increased. Therefore, the drive voltage can be decreased to achieve the reduction of power consumption.

Because the thin-film dome 26 includes the brittle material, the spring constant of the thin-film dome 26 depends on the spring constant of the brittle material included in the thin-film dome 26. Therefore, creep deformation of the thin-film dome 26 can be suppressed even if stress is applied for a long time during the movement.

Assuming that V is the internal volume of the thin-film dome 26 and P is the internal pressure of the thin-film dome 26, then, according to Boyle's law $$PV = \text{constant.} \quad (1)$$

On the basis of Equation 1, when the external pressure on the thin-film dome 26 is increased by ΔP, $$PV = (P - \Delta P) \cdot (V - \Delta V). \quad (2)$$

That is, the volume is decreased by ΔV to balance the inner and outer pressures of the thin-film dome 26 with each other. Assuming that a planar area of the thin-film dome 26 is kept constant, in the thin-film dome 26, when ΔP is kept constant, the volume change ΔV is increased with increasing the inner volume V. Therefore, the change of distance between the electrodes is increased to increase the change of the capacitance between the electrodes. That is, the sensitivity of the pressure sensor can be enhanced with increasing volume V of the thin-film dome 26.

However, in the case that the thin-film dome is used as the movable electrode, the distance between the thin-film dome and the fixed electrode is lengthened when the volume of the thin-film dome is increased. Therefore, the capacitance between the thin-film dome and the fixed electrode is decreased to degrade the sensitivity of the pressure sensor. For this reason, the volume of the thin-film dome cannot simply be increased.

On the other hand, in the first embodiment, the upper electrode 15 connected to the thin-film dome 26 is provided as the movable electrode. Therefore, even if the volume of the thin-film dome 26 is increased, the above problem can be solved unless the distance between the upper electrode 15 and the lower electrode 11 is lengthened. More specifically, the distance between the upper electrode 15 and the thin-film dome 26 is lengthened, namely, the vertical distance (length) of the anchor portion 25 is lengthened. Therefore, the inner volume of the thin-film dome 26 can be increased without changing the capacitance between the upper electrode 15 and the lower electrode 11, and the sensitivity of the pressure sensor can be enhanced. At this point, the distance (the vertical length of the anchor portion 25) between the upper electrode 15 and the thin-film dome 26 is longer than the distance between the upper electrode 15 and the lower electrode 11, so that the capacitance can sufficiently be obtained between the upper electrode 15 and the lower electrode 11.

The distance between the upper electrode 15 and 15, the lower electrode 11 means a distance in the state, in which the upper electrode 15 does not move vertically before the movement and the spring portion 16 is parallel to the surface of the substrate 10. In other words, the distance between the upper electrode 15 and the lower electrode 11 means the distance in the state, in which irregularity is not generated in the thin-film dome 26 by the pressure from the outside but parts of the upper electrode 15, the spring portion 16, and the anchor portion 14 are located at the same level.

Second Embodiment

A MEMS element according to a second embodiment will be described with reference to FIGS. 5A and 5B. In the first embodiment, the upper electrode 15 is supported by the anchor portion 14 with the spring portion 16 interposed therebetween, and the upper electrode 15 is also supported by the anchor portion 25 connected to the thin-film dome 26. On the other hand, in a second embodiment, by way of example, the upper electrode 15 is not supported by the spring portion 16 and the anchor portion 14, but the upper electrode 15 is supported only by the anchor portion 25 connected to the thin-film dome 26. The second embodiment will be described in detail below. In the second embodiment, the description of the same point as the first embodiment is omitted, and different point is mainly described.

[Structure]

A structure of the MEMS element of the second embodiment will be described below with reference to FIGS. 5A and 5B.

FIG. 5A is a plan view illustrating the structure of the MEMS element of the second embodiment. FIG. 5B is a sectional view illustrating the structure of the MEMS element of the second embodiment, and a sectional view taken on a line B-B of FIG. 5A.

As illustrated in FIGS. 5A and 5B, in the MEMS element of the second embodiment, the upper electrode 15 is supported only by the central portion in the plane of the anchor portion 25 located over the upper electrode 15. That is, the spring portion 16 and the anchor portion 14 of the first embodiment do not exist.

For example, the first layer 18 of the thin-film dome 26 may consist of a brittle conductive material such as WSi or AlSi. Alternatively, the first layer 18 may consist of a conductive ductile material such as Al or Au. At this point, because it is necessary to enhance the stiffness of the whole thin-film dome 26, the third layer 22 consists of a brittle material such as SiN.

The first layer 18 is connected to an interconnection 50 on the substrate 10, and connected to various circuits through the interconnection 50. That is, the upper electrode 15 is electrically connected to the interconnection 50 through the anchor portion 25 (first layer 18) by contacting the conductive anchor portion 25 that is of the conductor, whereby the upper electrode 15 is connected to various circuits.

The interconnection 50 may be formed at the same time as the lower electrode 11, or formed at the same time as the first layer 18. Therefore, the interconnection 50 is made of the same material as the lower electrode 11 or the first layer 18. Alternatively, the interconnection 50 may be formed in a process different from the lower electrode 11 and the first layer 18 with a different material.

[Movement]

The movement of the MEMS element of the second embodiment will be described below.

In the MEMS element of the second embodiment, the lower electrode 11 is connected to various circuits through the interconnection 24, and the upper electrode 15 is connected to various circuits through the anchor portion 25 (first layer 18) and the interconnection 50.

Therefore, in the second embodiment, the capacitance (electrostatic capacitance) between the upper electrode 15 and the lower electrode 11 is changed according to the change in distance between the upper electrode 15 and the lower electrode 11, so that the MEMS element can be applied to various devices.

In the case that the MEMS element is applied to the pressure sensor, the MEMS element is connected to the capacitance detection circuit 40 that detects the capacitance between the upper electrode 15 and the lower electrode 11.

More specifically, one end of the capacitance detection circuit 40 is connected to the interconnection 50, and the other end is connected to the interconnection 24. That is, one end is electrically connected to the upper electrode 15 through the interconnection 50 and the first layer 18, and the other end is electrically connected to the lower electrode 11 through the interconnection 24.

On the other hand, in the case that the MEMS element is applied to the variable capacitance or the micropump, the MEMS element is connected to the drive circuit 41 that applies a voltage to the upper electrode 15 and the lower electrode 11.

More specifically, one end of the drive circuit 41 is connected to the interconnection 50, and the other end is connected to the interconnection 24. That is, in the drive circuit 41, one end is electrically connected to the upper electrode 15 through the interconnection 50 and the first layer 18, and the other end is connected to the lower electrode 11 through the interconnection 24.

[Effect]

According to the second embodiment, the same effect as the first embodiment can be obtained.

Additionally, in the second embodiment, the upper electrode 15 is not supported by the spring portion 16 and the anchor portion 14, but the upper electrode 15 is supported only by the anchor portion 25 connected to the thin-film dome 26. That is, it is not necessary to form the spring portion 16 and the anchor portion 14.

Third Embodiment

A MEMS element according to a third embodiment will be described with reference to FIGS. 6A and 6B. In the first embodiment, the upper electrode 15 is connected to the thin-film dome 26 with one anchor portion 25 interposed therebetween. On the other hand, in a third embodiment, by way of example, the upper electrode 15 is connected to the thin-film dome 26 with plural anchor portions 60 interposed therebetween. The third embodiment will be described in detail below. In the third embodiment, the description of the same point as the first embodiment is omitted, and a different point is mainly described.

[Structure]

A structure of the MEMS element of the third embodiment will be described below with reference to FIGS. 6A and 6B.

FIG. 6A is a plan view illustrating the structure of the MEMS element of the third embodiment. FIG. 6B is a sectional view illustrating the structure of the MEMS element of the third embodiment, and a sectional view taken on a line C-C of FIG. 6A.

As illustrated in FIGS. 6A and 6B, in the MEMS element of the third embodiment, the upper electrode 15 is supported by the plural anchor portions 60 located over the upper electrode 15. In other words, the upper surface of the upper electrode 15 contacts the anchor portions 60. The anchor portion 60 and the thin-film dome 26 are integrally formed, and the anchor portion 60 is made of the same material as the thin-film dome 26. In other words, the anchor portion 60 projects downward from the thin-film dome 26. That is, the upper electrode 15 is connected to the thin-film dome 26 through the anchor portions 60.

Although the anchor portions 60 may be disposed at arbitrary positions in the plane of the upper electrode 15, desirably the anchor portions 60 are symmetrically disposed with respect to the central portion in the plane of the upper electrode 15.

In FIG. 6, the upper electrode 15 is supported by the two anchor portions 60. Alternatively, the upper electrode 15 may be supported by at least three anchor portions 60.

[Effect]

According to the third embodiment, the same effect as the first embodiment can be obtained.

Additionally, in the third embodiment, the upper electrode 15 is connected to the thin-film dome 26 through the plural anchor portions 60. Therefore, connection strength between the upper electrode 15 and the thin-film dome 26 can be enhanced. The connection strength is effectively enhanced in the case that the MEMS element is applied to the variable capacitance and the micropump, in which it is necessary to be driven by the drive circuit 41.

Fourth Embodiment

A MEMS element according to a fourth embodiment will be described with reference to FIGS. 7A and 7B. In a fourth embodiment, by way of example, the MEMS element includes a first lower electrode 71 and a second lower electrode 72, and detects the capacitance between the first lower electrode 71 and the second lower electrode 72 while the upper electrode 15 that is of a floating state is interposed therebetween. In the fourth embodiment, the description of the same point as the first embodiment is omitted, and a different point is mainly described. The fourth embodiment will be described in detail below.

[Structure]

A structure of the MEMS element of the fourth embodiment will be described below with reference to FIGS. 7A and 7B.

Figure 7A:
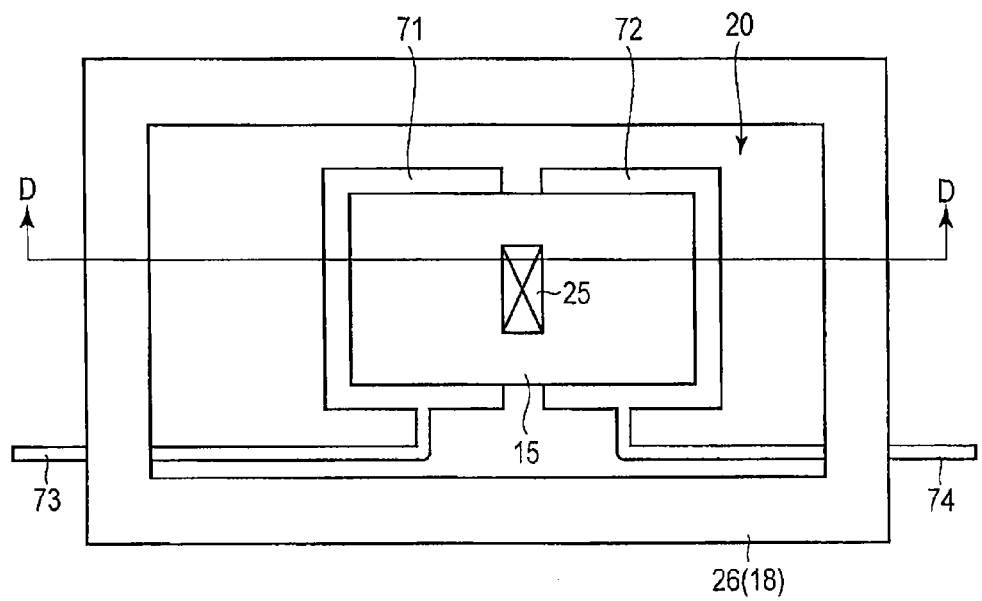
FIG. 7A is a plan view illustrating a structure of a MEMS element according to a fourth embodiment.

FIG. 7A is a plan view illustrating the structure of the MEMS element of the fourth embodiment. FIG. 7B is a sectional view illustrating the structure of the MEMS element of the fourth embodiment, and a sectional view taken along line D-D of FIG. 7A.

Figure 7B:
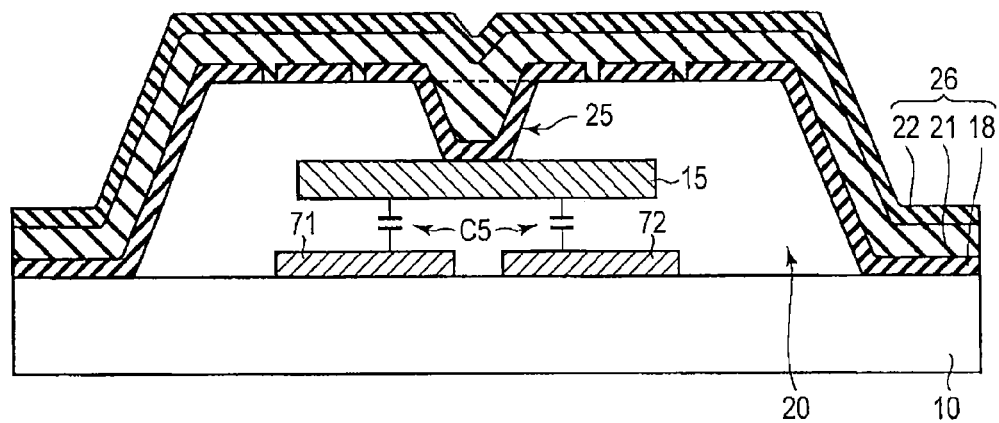
FIG. 7B is a sectional view illustrating the structure of the MEMS element of the fourth embodiment.

As illustrated in FIGS. 7A and 7B, the MEMS element of the fourth embodiment includes the first lower electrode 71 and the second lower electrode 72. The upper electrode 15 is supported only by the central portion in the plane of the anchor portion 25 located over the upper electrode 15. That is, the spring portion 16 and the anchor portion 14 of the first embodiment do not exist.

The first lower electrode 71 and the second lower electrode 72 are formed on and fixed on the substrate 10. The first lower electrode 71 and the second lower electrode 72 have plate shapes parallel to the surface of the substrate 10. For example, the first lower electrode 71 and the second lower electrode 72 are made of Al, an alloy mainly containing Al, Cu, Au, or Pt. The first lower electrode 71 is connected to various circuits through an interconnection 73 that is made of the same material as the first lower electrode 71. The second lower electrode 72 is connected to various circuits through an interconnection 74 that is made of the same material as the second lower electrode 72.

The first lower electrode 71 and the second lower electrode 72 are separated from each other in a first direction. The first lower electrode 71 and the second lower electrode 72 are disposed facing part of the upper electrode 15. More specifically, the first lower electrode 71 is facing one side of the upper electrode 15 in the first direction, and the second lower electrode 72 is facing the other side. That is, when viewed from above, the first lower electrode 71 overlaps one side of the upper electrode 15 in the first direction, and the second lower electrode 72 overlaps the other side.

In FIG. 7A, the first lower electrode 71 and the second lower electrode 72 have a rectangular shape when viewed from above. Alternatively, the first lower electrode 71 and the second lower electrode 72 have a circular shape or an ellipsoidal shape.

The upper electrode 15 is movable in a direction (vertical direction) perpendicular to the surface of the substrate 10. That is, the distance between the upper electrode 15 and the first lower electrode 71 and the distance between the upper electrode 15 and the second lower electrode 72 are changed. The capacitance between the first lower electrode 71 and the second lower electrode 72 with the upper electrode 15 interposed therebetween is changed in conjunction with the changes in distance between the upper electrode 15 and the first lower electrode 71 and distance between the upper electrode 15 and the second lower electrode 72 are changed.

[Movement]

The movement of the MEMS element of the fourth embodiment will be described below.

In the MEMS element of the fourth embodiment, the first lower electrode 71 is connected to various circuits through an interconnection 73, and the second lower electrode 72 is connected to various circuits through an interconnection 74. The upper electrode 15 is in the floating state.

Therefore, in the fourth embodiment, a capacitance C5 between the first lower electrode 71 and the second lower electrode 72 with the upper electrode 15 interposed therebetween is changed according to the changes in distance between the upper electrode 15 and the first lower electrode 71 and distance between the upper electrode 15 and the second lower electrode 72, so that the MEMS element can be applied to various devices.

In the case that the MEMS element is applied to the pressure sensor, the MEMS element is connected to the capacitance detection circuit 40 that detects the capacitance between the first lower electrode 71 and the second lower electrode 72.

More specifically, one end of the capacitance detection circuit 40 is connected to the interconnection 73, and the other end is connected to the interconnection 74. That is, in the capacitance detection circuit 40, one end is electrically connected to the first lower electrode 71 through the interconnection 73, and the other end is connected to the second lower electrode 72 through the interconnection 74.

On the other hand, in the case that the MEMS element is applied to the variable capacitor or the micropump, the MEMS element is connected to the drive circuit 41 that applies the voltage to the first lower electrode 71 and the second lower electrode 72.

More specifically, one end of the drive circuit 41 is connected to the interconnection 73, and the other end is connected to the interconnection 74. That is, in the drive circuit 41, one end is electrically connected to the first lower electrode 71 through the interconnection 73, and the other end is electrically connected to the second lower electrode 72 through the interconnection 74.

[Effect]

According to the fourth embodiment, the same effect as the second embodiment can be obtained.

Fifth Embodiment

A MEMS element according to a fifth embodiment will be described with reference to FIGS. 8A, 8B, 9A, and 9B. In a fifth embodiment, by way of example, the MEMS element includes a reference lower electrode 86 and a reference upper electrode 89. In the fifth embodiment, the description of the same point as the first embodiment is omitted, and a different point is mainly described. The fifth embodiment will be described in detail below.

[Structure]

A structure of the MEMS element of the fifth embodiment will be described below with reference to FIGS. 8A and 8B.

FIG. 8A is a plan view illustrating the structure of the MEMS element of the fifth embodiment. FIG. 8B is a sectional view illustrating the structure of the MEMS element of the fifth embodiment, and a sectional view taken on a line E-E of FIG. 8A.

As illustrated in FIGS. 8A and 8B, the MEMS element of the fifth embodiment includes the reference lower electrode 86 and the reference upper electrode 89, which are accommodated in the end portion in the cavity 20 of the thin-film dome 26. The reference lower electrode 86 and the reference upper electrode 89 have the structures identical to those of the lower electrode 11 and the upper electrode 15, respectively. The reference lower electrode 86 and the reference upper electrode 89 are simultaneously formed in the identical process. The reference lower electrode 86 and the reference upper electrode 89 are insulated from the lower electrode 11 and the upper electrode 15. The lower electrode 11 is not connected to the interconnection 24 of the first embodiment, and the lower electrode 11 is in the floating state.

The reference lower electrode 86 is formed on and fixed on the substrate 10. The reference lower electrode 86 is formed into the plate shape parallel to the surface of the substrate 10. For example, the reference lower electrode 86 is made of the same material as the lower electrode 11. The reference lower electrode 86 is in the floating state.

The reference upper electrode 89 is formed above the reference lower electrode 86. The reference upper electrode 89 is formed into the plate shape parallel to the surface of the substrate 10, and disposed opposite the reference lower electrode 86. That is, the reference upper electrode 89 overlaps the lower electrode 11 in the plane. In FIG. 8A, the planar size of the reference upper electrode 89 is smaller than that of the reference lower electrode 86. Alternatively, the planar size of the reference upper electrode 89 may be equal to or larger than that of the reference lower electrode 86. In FIG. 8A, the reference upper electrode 89 and the reference lower electrode 86 have a rectangular shape when viewed from above. Alternatively, the reference upper electrode 89 and the reference lower electrode 86 have a circular shape or an ellipsoidal shape. For example, the reference upper electrode 89 is made of the same material as the upper electrode 15.

One end of a spring portion 90 is connected to the end portion in the plane of the reference upper electrode 89. The spring portion 90 and the reference upper electrode 89 are integrally formed. For example, the spring portion 90 is made of the same conductive material as the reference upper electrode 89. The spring portion 90 and the reference upper electrode 89 constitute the single-layer structure in which the spring portion 90 and the reference upper electrode 89 are unified, and the spring portion 90 has the meander shape in the plane. In other words, the spring portion 90 is formed into the long, thin, and winding shape in the plane. The spring constant of the spring portion 90 is smaller than that of the reference upper electrode 89 by properly setting at least one of the line width, the thickness, and the curvature of the spring portion 90. The spring constant of the spring portion 90 is smaller than that of the reference upper electrode 89.

An anchor portion 88 is connected to the other end of the spring portion 90. That is, the reference upper electrode 89 is supported by the anchor portion 88 with the spring portion 90 interposed therebetween. The anchor portion 88 and the spring portion 90 are integrally formed, and the anchor portion 88 is made of the same conductive material as the spring portion 90. The anchor portion 88 is connected to an interconnection 87 disposed on the substrate 10. The interconnection 87 is formed at the level of the reference lower electrode 86, and made of the same conductive material as the reference lower electrode 86. The reference upper electrode 89 is electrically connected to the interconnection 87 through the spring portion 90 and the anchor portion 88, and connected to various circuits.

The reference lower electrode 86 and the reference upper electrode 89 do not necessarily have the same sizes (area) as the lower electrode 11 and the upper electrode 15. The reference lower electrode 86 and the reference upper electrode 89 may be made of materials different from the lower electrode 11 and the upper electrode 15.

FIG. 9A is a plan view illustrating a structure of a MEMS element according to a modification of the fifth embodiment. FIG. 9B is a sectional view illustrating the structure of the MEMS element of the modification of the fifth embodiment, and a sectional view taken on a line F-F of FIG. 9A.

As illustrated in FIGS. 9A and 9B, the reference lower electrode 86 and the reference upper electrode 89 may be formed in a cavity 20a of a thin-film dome 26a that is different from that of the lower electrode 15 and the upper electrode 15.

The thin-film dome 26a integral with the thin-film dome 26 is formed adjacent to the thin-film dome 26. That is, the thin-film dome 26a includes a first layer 18a, a second layer 21a, and a third layer 22a, which are sequentially stacked from the inside while formed integral with the first layer 18, the second layer 21, and the third layer 22.

[Movement]

The movement of the MEMS element of the fifth embodiment will be described below.

In the MEMS element of the fifth embodiment, the lower electrode 11 is in the floating state, and the upper electrode 15 is connected to the interconnection 12 through the spring portion 16 and the anchor portion 14, and connected to various circuits. The reference lower electrode 86 is in the floating state, and the reference upper electrode 89 is electrically connected to the interconnection 87 through the spring portion 90 and the anchor portion 88 and connected to the various circuits.

The lower electrode 11 and the upper electrode 15 have the same structures as the reference lower electrode 86 and the reference upper electrode 89.

Therefore, in the fifth embodiment, a capacitance C6 between the upper electrode 15 and the lower electrode 11 that is of the floating electrode is changed according to the change in distance between the upper electrode 15 and the lower electrode 11. On the other hand, the reference upper electrode 89 is not connected to the thin-film dome 26. That is, both the reference upper electrode 89 and the reference lower electrode 86 are the fixed electrodes, and a capacitance Cref between the reference upper electrode 89 and the reference lower electrode 86 is not changed. The MEMS element can be applied to various devices by comparing capacitance C6 and capacitance Cref.

In the case that the MEMS element is applied to the pressure sensor, the MEMS element is connected to the capacitance detection circuit 40 that compares capacitance C6 between upper electrode 15 and the lower electrode 11 and capacitance Cref between the reference upper electrode 89 and the reference lower electrode 86 to detect capacitance C6.

More specifically, one end of the capacitance detection circuit 40 is connected to the interconnection 12, and the other end is connected to the interconnection 87. That is, in the capacitance detection circuit 40, one end is electrically connected to the upper electrode 15 through the interconnection 12, and the other end is electrically connected to the reference upper electrode 89 through the interconnection 87.

In the fifth embodiment, capacitance C6 is detected by comparing capacitance (floating capacitance) C6 between the upper electrode 15 and the lower electrode 11 that is of the floating electrode and reference capacitance (reference floating capacitance) Cref between the reference upper electrode 89 and the reference lower electrode 86 that is of the floating electrode. Alternatively, the lower electrode 11 and the reference lower electrode 86 are connected to various circuits through the interconnections, and the upper electrode 15 and the reference upper electrode 89 may be used as the floating electrodes. Alternatively, the upper electrode 15 and the reference upper electrode 89 are connected to various circuits through the interconnections 12 and 87, and the lower electrode 11 and the reference lower electrode 86 are connected to various circuits through the interconnections, and the capacitance between the upper electrode 15 and the lower electrode 11 and the capacitance between the reference upper electrode 89 and the reference lower electrode 86 may be detected and compared.

[Effect]

According to the fifth embodiment, the same effect as the first embodiment can be obtained.

When the area of the upper electrode 15 is enlarged, the upper electrode 15 warps because of residual stress in the upper electrode 15. As a result, a parallel state is hardly maintained between the upper electrode 15 and the lower electrode 11. Particularly, detection accuracy of the capacitance between the electrodes is degraded when warpage varies depending on the temperature or the chip.

On the other hand, in the fifth embodiment, the reference upper electrode 89 and the reference lower electrode 86, which have invariable reference capacitance Cref, are formed in the thin-film dome 26. The reference upper electrode 89 and the reference lower electrode 86 are placed in the same environment as the upper electrode 15 and the lower electrode 11 in the thin-film dome 26. That is, the reference upper electrode 89 has the warpage (warp ratio) similar to that of the upper electrode 15. Therefore, capacitance C6 is detected by comparing reference capacitance Cref and capacitance C6, so that the variation in capacitance due to the warpage can be cancelled. As a result, the variation in capacitance between the electrodes depending on the temperature or the chip can be reduced.

Sixth Embodiment

A MEMS element according to a sixth embodiment will be described with reference to FIGS. 10A and 10B. In a sixth embodiment, by way of example, the upper electrode 15 is also supported by a spring portion 100 and an anchor portion 101. The sixth embodiment will be described in detail below.

In the sixth embodiment, the description of the same point as the first embodiment is omitted, and a different point is mainly described.

[Structure]

A structure of the MEMS element of the sixth embodiment will be described below with reference to FIGS. 10A and 10B.

Figure 10A:
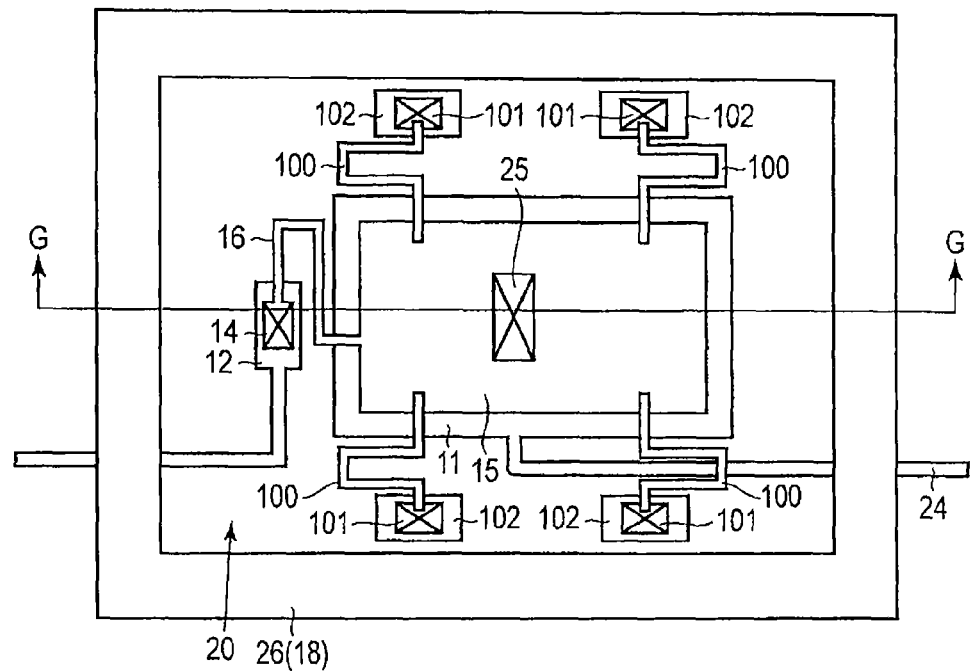
FIG. 10A is a plan view illustrating a structure of a MEMS element according to a sixth embodiment.

FIG. 10A is a plan view illustrating the structure of the MEMS element of the sixth embodiment. FIG. 10B is a sectional view illustrating the structure of the MEMS element of the sixth embodiment, and a sectional view taken on a line G-G of FIG. 10A. FIG. 10B also illustrates a spring portion 100, an anchor portion 101, and a dummy interconnection 102.

Figure 10B:
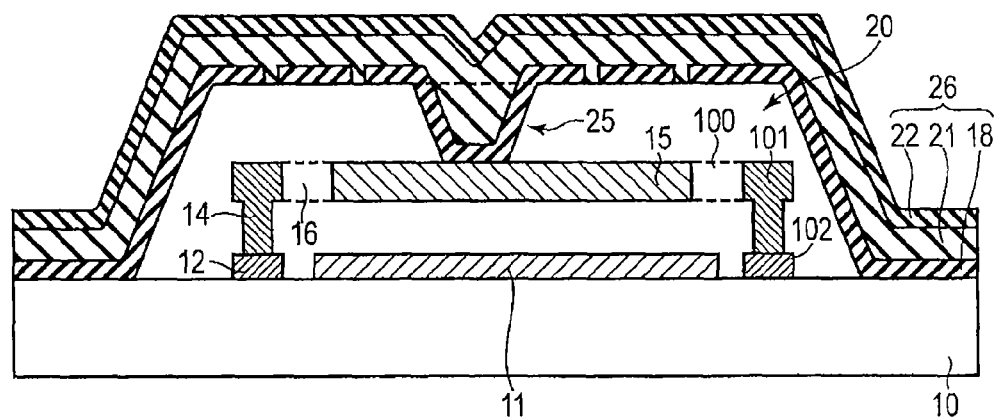
FIG. 10B is a sectional view illustrating the structure of the MEMS element of the sixth embodiment.

As illustrated in FIGS. 10A and 10B, in the MEMS element of the sixth embodiment, one end of the spring portion 100 is connected to the end portion in the plane of the upper electrode 15. The anchor portion 101 is connected to the other end of the spring portion 100. That is, the upper electrode 15 is supported with the spring portion 100 interposed therebetween. The anchor portion 101 is connected to the dummy interconnection 102 disposed on the substrate 10. The dummy interconnection 102 is in the floating state.

In FIG. 10A, each four of the spring portions 100, the anchor portions 101, and the dummy interconnections 102 are provided. Alternatively, one to three or at least five of the spring portions 100, the anchor portions 101, and the dummy interconnections 102 may be provided.

For example, the spring portion 100 is made of a brittle conductive or insulating material; that is, as the first layer 18, a brittle insulating material such as SiO ($SiO_2$) or SiN, or a brittle conductive material such as WSi or AlSi, is used. For example, the anchor portion 101 and the spring portion 16 are integrally formed, and the anchor portion 101 is made of the same conductive material as the spring portion 16. However, there is no limitation to the formation and material of the anchor portion 101. For example, the dummy interconnection 102 is formed at the level of the lower electrode 11, and the dummy interconnection 102 is made of the same material as the lower electrode 11. There is no limitation to the formation and material of the dummy interconnection 102.

On the other hand, as described above, the spring portion 16 is made of the ductile material. At this point, the spring constant of the spring portion 100 is larger than that of the spring portion 16 by properly setting at least one of the line width, the thickness, and the curvature of the spring portion 100.

[Effect]

According to the sixth embodiment, the same effect as the first embodiment can be obtained.

Additionally, in the sixth embodiment, the upper electrode 15 is supported by not only the spring portion 16, which is made of a ductile material and has a small spring constant, but also by the spring portion 100, which is made of a brittle material and has a large spring constant. Therefore, creep of the upper electrode 15 can be suppressed compared with the case that upper electrode 15 is supported only by the spring portion 16.

The upper electrode 15 is supported by the spring portions 16 and 100. In other words, the upper electrode 15 is supported at the plural points in the end portions. Therefore, the warpage of the upper electrode 15, which is caused by the residual stress, can be suppressed even if the upper electrode 15 has a large area.

The warpage of the upper electrode 15 can also be suppressed using the spring portion 100 that is made of the same ductile material as the spring portion 16. In other words, the upper electrode 15 may be supported by the spring portions 16 and 100 made of the plural ductile materials. At this point, desirably the spring constant of the spring portion 100 is larger than that of the spring portion 16 by properly setting at least one of the line width, the thickness, and the curvature of the spring portion 100. However, there is no limitation to the spring constant of the spring portion 100.

The above embodiments may properly be combined within a range where a contradiction is not generated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A MEMS element comprising:
    a first electrode that is fixed on a substrate and has a plate shape;
    a second electrode that is disposed above the first electrode while facing the first electrode,
    the second electrode being movable in a vertical direction and having a plate shape; and
    a first film that covers a first cavity in which the second electrode is accommodated on the substrate,
    wherein
        the second electrode is connected to an anchor portion connected to the substrate via a spring portion,
        a part of an upper surface of the second electrode is connected to the first film,
        an empty space exists between the upper surface of the second electrode and the first film, and
        the first film has a spring constant enabling the first film to move vertically with respect to the first electrode.

2. The element of claim 1, wherein the first film includes an insulating material.

3. The element of claim 1, further comprising:
    a third electrode that is fixed on the substrate and has a plate shape; and
    a fourth electrode that is disposed above the third electrode while facing the third electrode, the fourth electrode having a plate shape,
    wherein the first cavity accommodates the fourth electrode.

4. The element of claim 3, wherein the first electrode is in a floating state.

5. The element of claim 1, further comprising:
    a third electrode that is fixed on the substrate and has a plate shape; and
    a fourth electrode that is disposed above the third electrode while facing the third electrode, the fourth electrode having a plate shape; and
    a second film that includes a second cavity in which the fourth electrode is accommodated on the substrate.

6. The element of claim 1, further comprising a circuit that detects a capacitance between the first electrode and the second electrode.

7. The element of claim 6, wherein the circuit is electrically connected to the first electrode and the second electrode.

8. The element of claim 1,
    wherein the first film includes a brittle material, and
    the spring constant of the first film depends on the brittle material.

9. The element of claim 1, wherein the spring constant of the first film is larger than a spring constant of the spring portion.

10. The element of claim 1, wherein a spring constant of the second electrode is larger than a spring constant of the spring portion.

11. The element of claim 1, wherein a distance between the first film and the second electrode is longer than a distance between the first electrode and the second electrode.

12. The element of claim 1, wherein the first film includes a first layer, a second layer, and a third layer, which are sequentially stacked from an inside.

13. The element of claim 12, wherein the first layer and the third layer include a brittle material.

14. The element of claim 1, wherein the first film includes a first layer including through-holes and a second layer closing the through-holes.

15. The element of claim 1, wherein the first film is continuously formed from a side of the first electrode and the second electrode to an upper side of the first electrode and the second electrode.

16. The element of claim 1, wherein the part of the upper surface of the second electrode is directly connected to the first film.

17. A MEMS element comprising:
a first electrode that is fixed on a substrate and has a plate shape;
a second electrode that is disposed above the first electrode while facing the first electrode,
the second electrode being movable in a vertical direction and having a plate shape; and
a first film that covers a first cavity in which the second electrode is accommodated on the substrate,
wherein
a part of an upper surface of the second electrode is connected to the first film,
an empty space exists between the upper surface of the second electrode and the first film,
the first film includes an insulating material, and
the first film has a spring constant enabling the first film to move vertically with respect to the first electrode.

18. The element of claim 17, further comprising:
a third electrode that is fixed on the substrate and has a plate shape; and
a fourth electrode that is disposed above the third electrode while facing the third electrode, the fourth electrode having a plate shape,
wherein the first cavity accommodates the fourth electrode.

19. The element of claim 18, wherein the first electrode is in a floating state.

20. The element of claim 17, further comprising:
a third electrode that is fixed on the substrate and has a plate shape;
a fourth electrode that is disposed above the third electrode while facing the third electrode, the fourth electrode having a plate shape; and
a second film that includes a second cavity in which the fourth electrode is accommodated on the substrate.

21. The element of claim 17, further comprising a circuit that detects a capacitance between the first electrode and the second electrode.

22. The element of claim 21, wherein the circuit is electrically connected to the first electrode and the second electrode.

23. The element of claim 17, wherein the first film includes a brittle material, and the spring constant of the first film depends on the brittle material.

24. The element of claim 17, wherein a distance between the first film and the second electrode is longer than a distance between the first electrode and the second electrode.

25. The element of claim 17, wherein the first film includes a first layer, a second layer, and a third layer, which are sequentially stacked from an inside, and the first layer includes a conductive material.

26. The element of claim 17, wherein the first film includes a first layer including through-holes and a second layer closing the through-holes.

27. The element of claim 17, wherein the first film is continuously formed from a side of the first electrode and the second electrode to an upper side of the first electrode and the second electrode.

28. The element of claim 17, wherein the part of the upper surface of the second electrode is directly connected to the first film.

29. A MEMS element comprising:
a first electrode that is fixed on a substrate and has a plate shape;
a second electrode that is disposed above the first electrode while facing the first electrode,
the second electrode being movable in a vertical direction and having a plate shape; and
a first film that includes a first cavity in which the second electrode is accommodated on the substrate,
the first film including a first layer including through-holes and a second layer closing the through-holes,
wherein
the second electrode is connected to an anchor portion connected to the substrate via a spring portion,
a part of an upper surface of the second electrode is connected to the first film,
an empty space exists between the upper surface of the second electrode and the first film, and
the first film has a spring constant enabling the first film to move vertically with respect to the first electrode.

30. A MEMS element comprising:
a first electrode that is fixed on a substrate and has a plate shape;
a second electrode that is disposed above the first electrode while facing the first electrode,
the second electrode being movable in a vertical direction and having a plate shape; and
a first film that includes a first cavity in which the second electrode is accommodated on the substrate,
the first film continuously formed from a side of the first electrode and the second electrode to an upper side of the first electrode and the second electrode,
wherein
a part of an upper surface of the second electrode is connected to the first film,
an empty space exists between the upper surface of the second electrode and the first film,
the first film includes an insulating material, and
the first film has a spring constant enabling the first film to move vertically with respect to the first electrode.

31. A MEMS element comprising:
a first electrode that is fixed on a substrate and has a plate shape;
a second electrode that is disposed above the first electrode while facing the first electrode,
the second electrode being movable in a vertical direction and having a plate shape; and
a first film that includes a first cavity in which the second electrode is accommodated on the substrate, the first film including a first layer including through-holes and a second layer closing the through-holes,
wherein
the second electrode is connected to an anchor portion connected to the substrate via a spring portion,
a part of an upper surface of the second electrode is connected to the first film,
an empty space exists between the upper surface of the second electrode and the first film, and
the first film has a spring constant enabling the first film to move vertically with respect to the first electrode.

32. A MEMS element comprising:
a first electrode that is fixed on a substrate and has a plate shape;
a second electrode that is disposed above the first electrode while facing the first electrode,
the second electrode being movable in a vertical direction and having a plate shape; and
a first film that includes a first cavity in which the second electrode is accommodated on the substrate,
the first film continuously formed from a side of the first electrode and the second electrode to an upper side of the first electrode and the second electrode,
wherein
a part of an upper surface of the second electrode is connected to the first film,
an empty space exists between the upper surface of the second electrode and the first film,
the first film includes an insulating material, and
the first film has a spring constant enabling the first film to move vertically with respect to the first electrode.

* * * * *